(12) United States Patent
Lee et al.

(10) Patent No.: US 9,136,377 B2
(45) Date of Patent: Sep. 15, 2015

(54) HIGH DENSITY MOSFET ARRAY WITH SELF-ALIGNED CONTACTS DELIMITED BY NITRIDE-CAPPED TRENCH GATE STACKS AND METHOD

(71) Applicants: Yeeheng Lee, San Jose, CA (US); Jongoh Kim, Portland, OR (US); Hong Chang, Saratoga, CA (US)

(72) Inventors: Yeeheng Lee, San Jose, CA (US); Jongoh Kim, Portland, OR (US); Hong Chang, Saratoga, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/794,628

(22) Filed: Mar. 11, 2013

(65) Prior Publication Data

US 2014/0252460 A1    Sep. 11, 2014

(51) Int. Cl.
*H01L 29/78*     (2006.01)
*H01L 29/66*     (2006.01)

(52) U.S. Cl.
CPC ...... *H01L 29/7827* (2013.01); *H01L 29/66666* (2013.01); *H01L 29/66734* (2013.01)

(58) Field of Classification Search
CPC ............... H01L 29/66666; H01L 29/7827; H01L 29/66734

USPC .......... 438/270, 586, 669; 257/129, 330, 331
See application file for complete search history.

(56) References Cited

U.S. PATENT DOCUMENTS

| | | | |
|---|---|---|---|
| 6,277,720 B1 * | 8/2001 | Doshi et al. | 438/586 |
| 2007/0267691 A1 * | 11/2007 | Chen et al. | 257/330 |
| 2011/0254086 A1 * | 10/2011 | Hsieh | 257/330 |
| 2011/0291186 A1 * | 12/2011 | Yilmaz et al. | 257/334 |
| 2012/0037954 A1 * | 2/2012 | Hshieh | 257/139 |

* cited by examiner

*Primary Examiner* — Matthew Reames
*Assistant Examiner* — Vincent Wall
(74) *Attorney, Agent, or Firm* — Chein-Hwa Tsao

(57) ABSTRACT

A high density trench-gated MOSFET array and method are disclosed. It comprises semiconductor substrate partitioned into MOSFET array area and gate pickup area; epitaxial region, body region and source region; numerous precisely spaced active nitride-capped trench gate stacks (ANCTGS) embedded till the epitaxial region. Each ANCTGS comprises a stack of polysilicon trench gate with gate oxide shell and silicon nitride cap covering top of polysilicon trench gate and laterally registered to gate oxide shell. The ANCTGS forms, together with the source, body, epitaxial region, a MOSFET device in the MOSFET array area. Over MOSFET array area and gate pickup area, a patterned dielectric region atop the MOSFET array and a patterned metal layer atop the patterned dielectric region. Thus, the patterned metal layer forms, with the MOSFET array and the gate pickup area, self-aligned source and body contacts through the inter-ANCTGS separations.

8 Claims, 18 Drawing Sheets

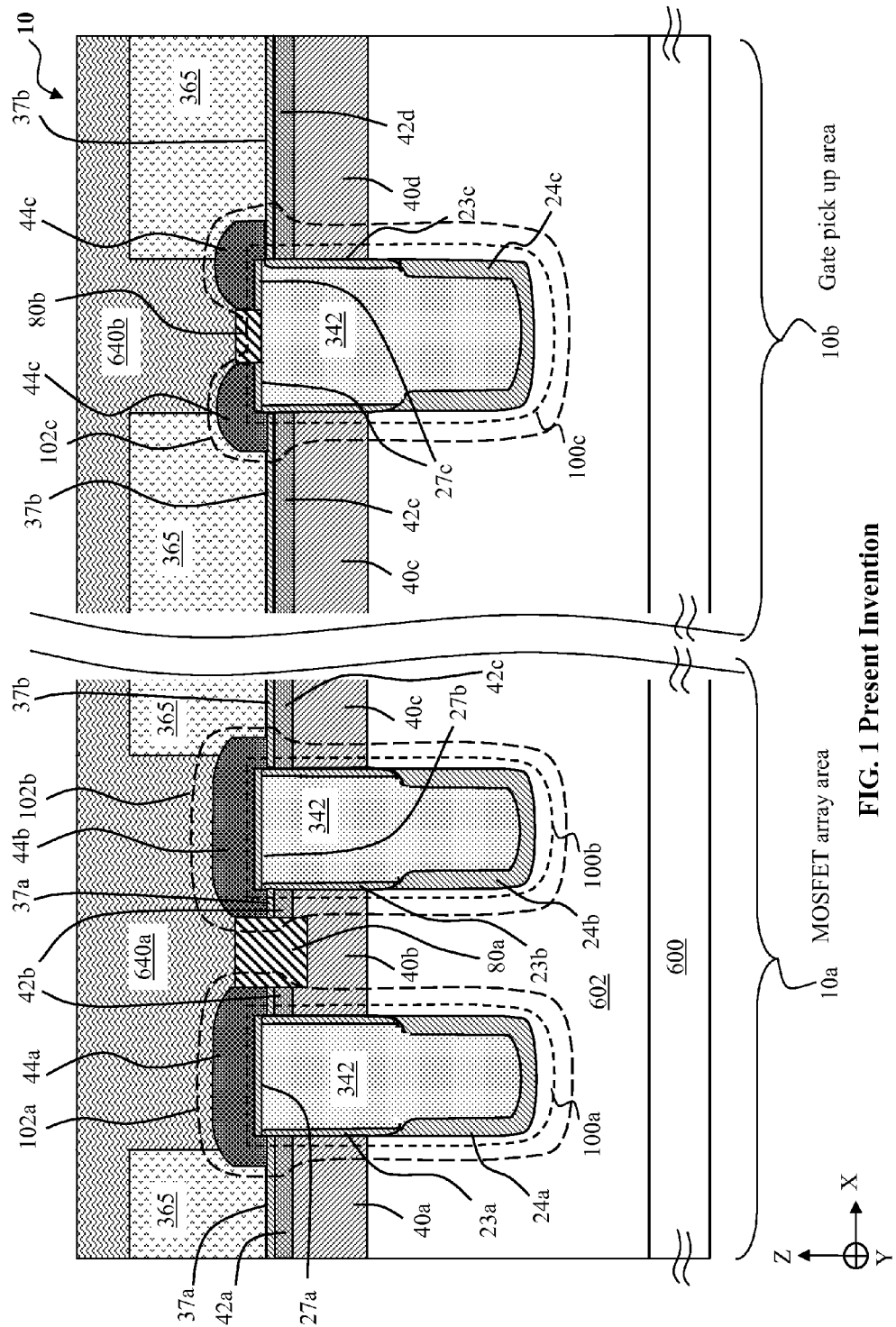
FIG. 1 Present Invention

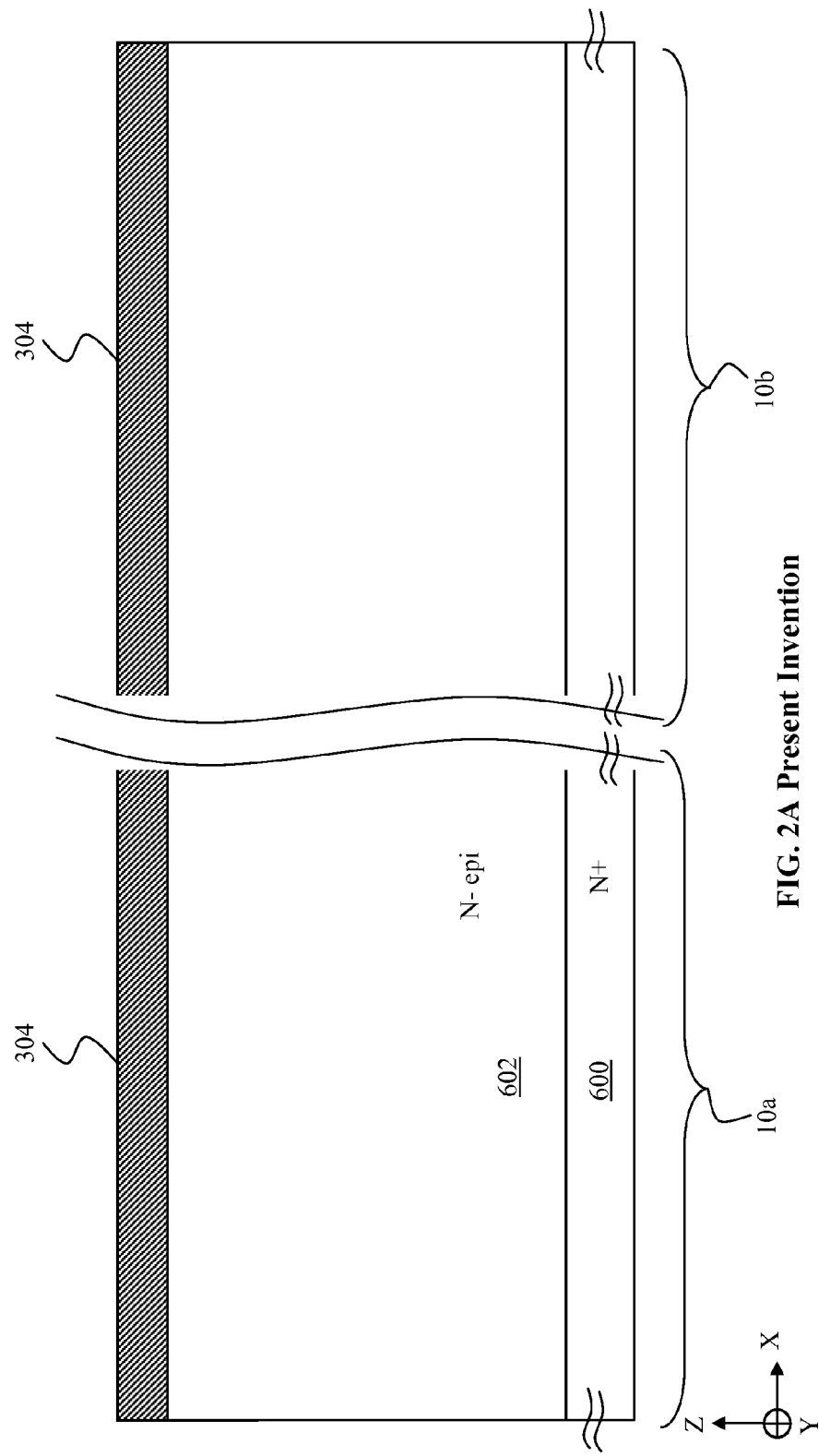
FIG. 2A Present Invention

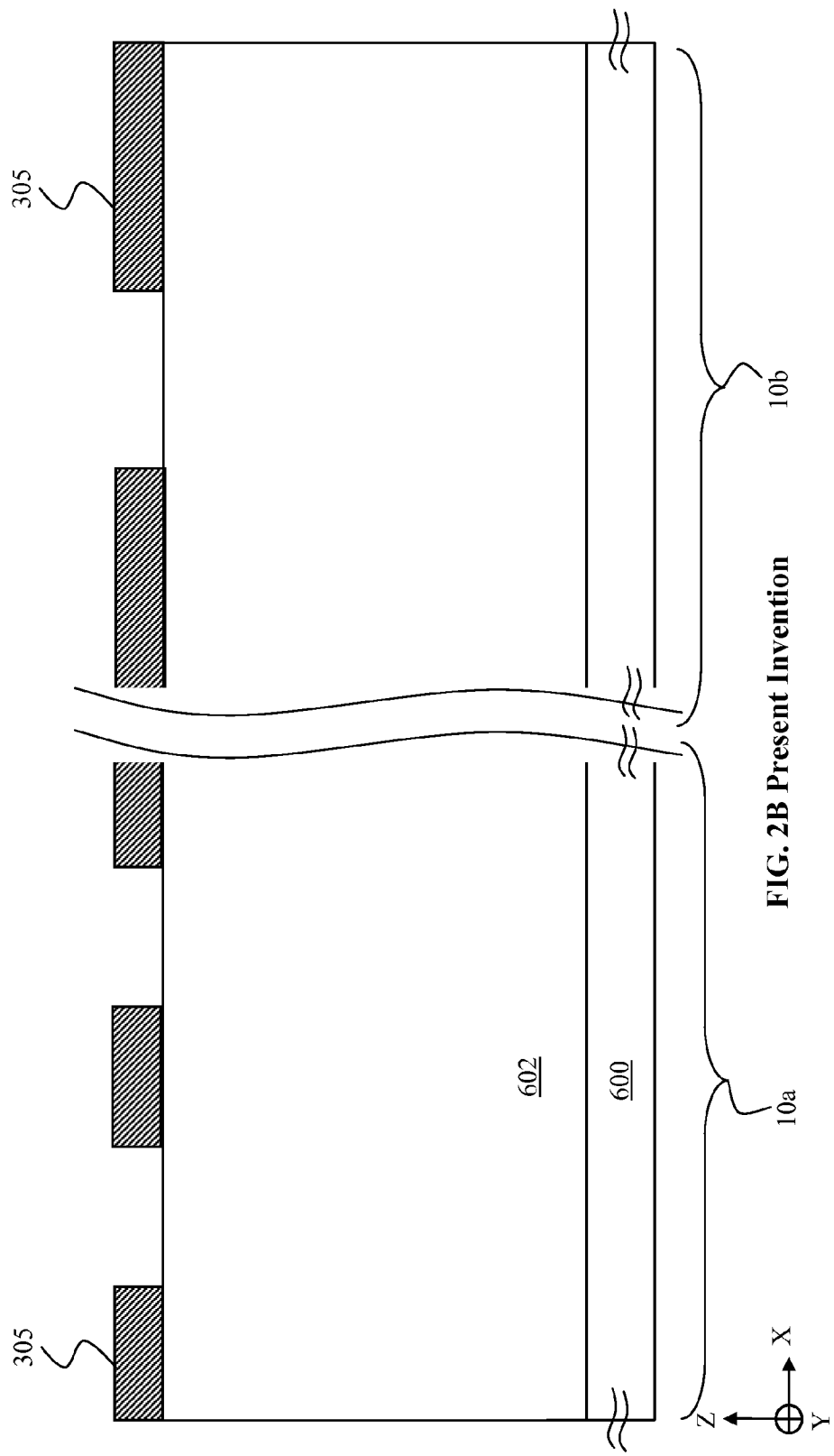
FIG. 2B Present Invention

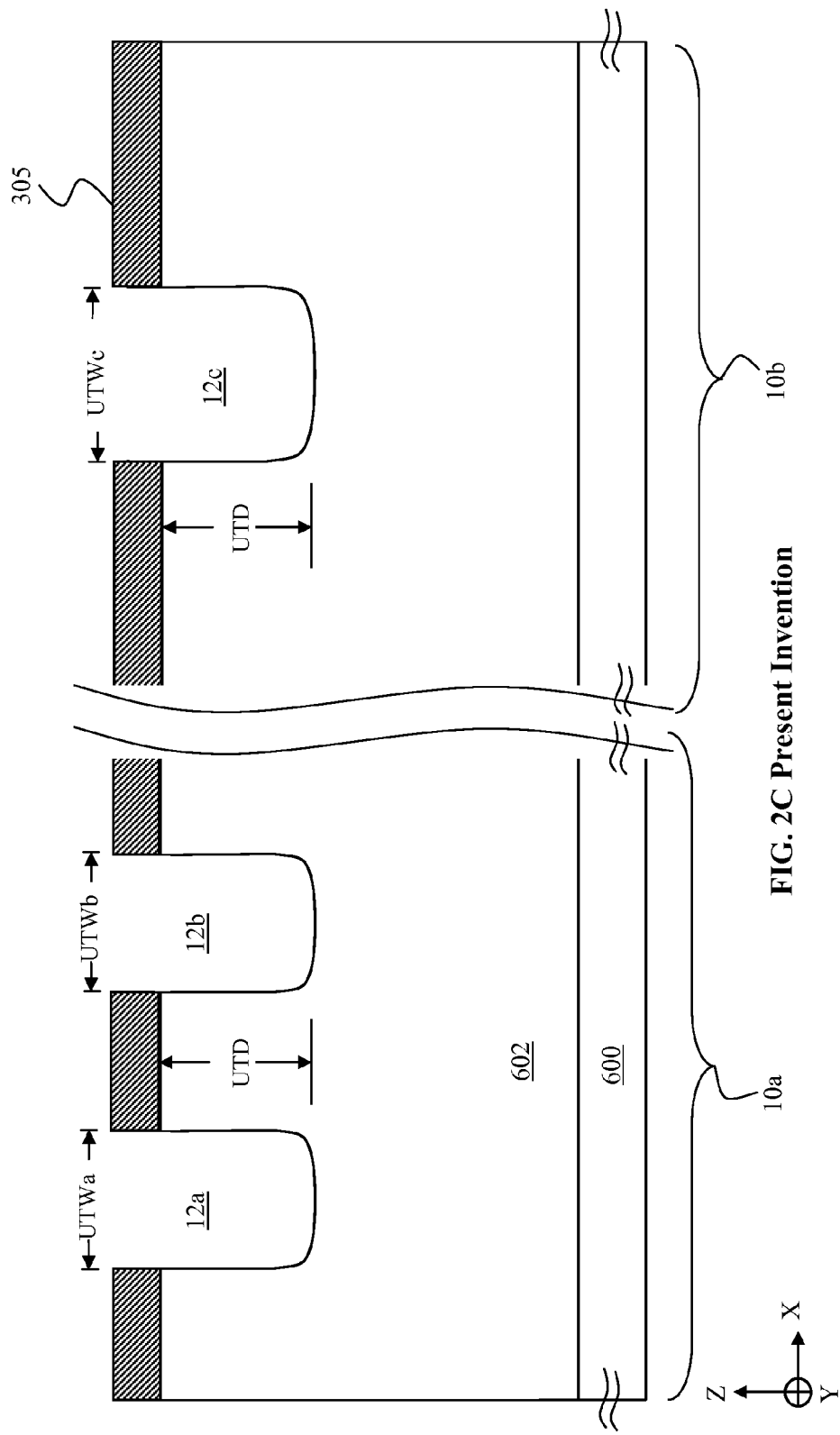
FIG. 2C Present Invention

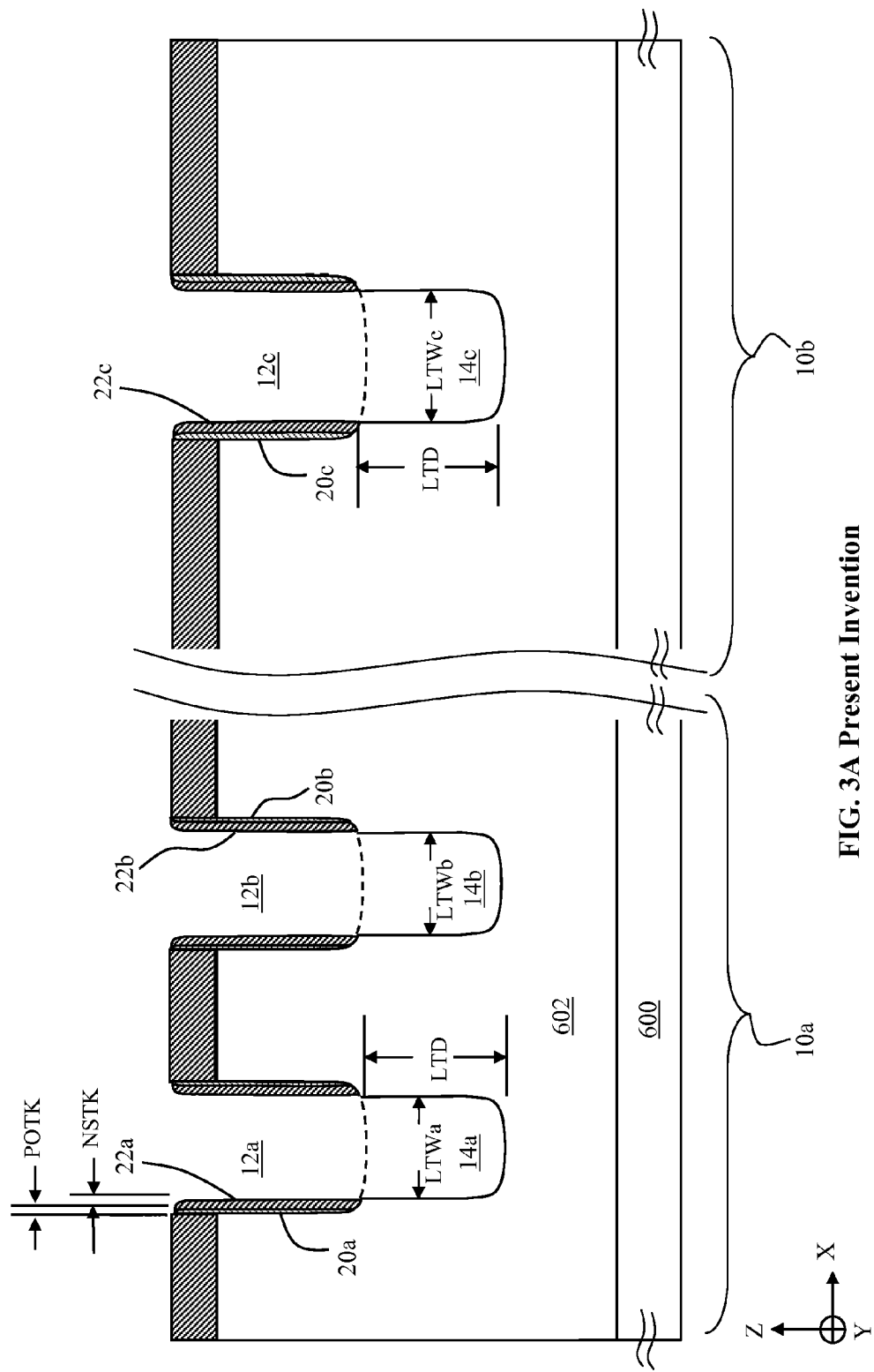
FIG. 3A Present Invention

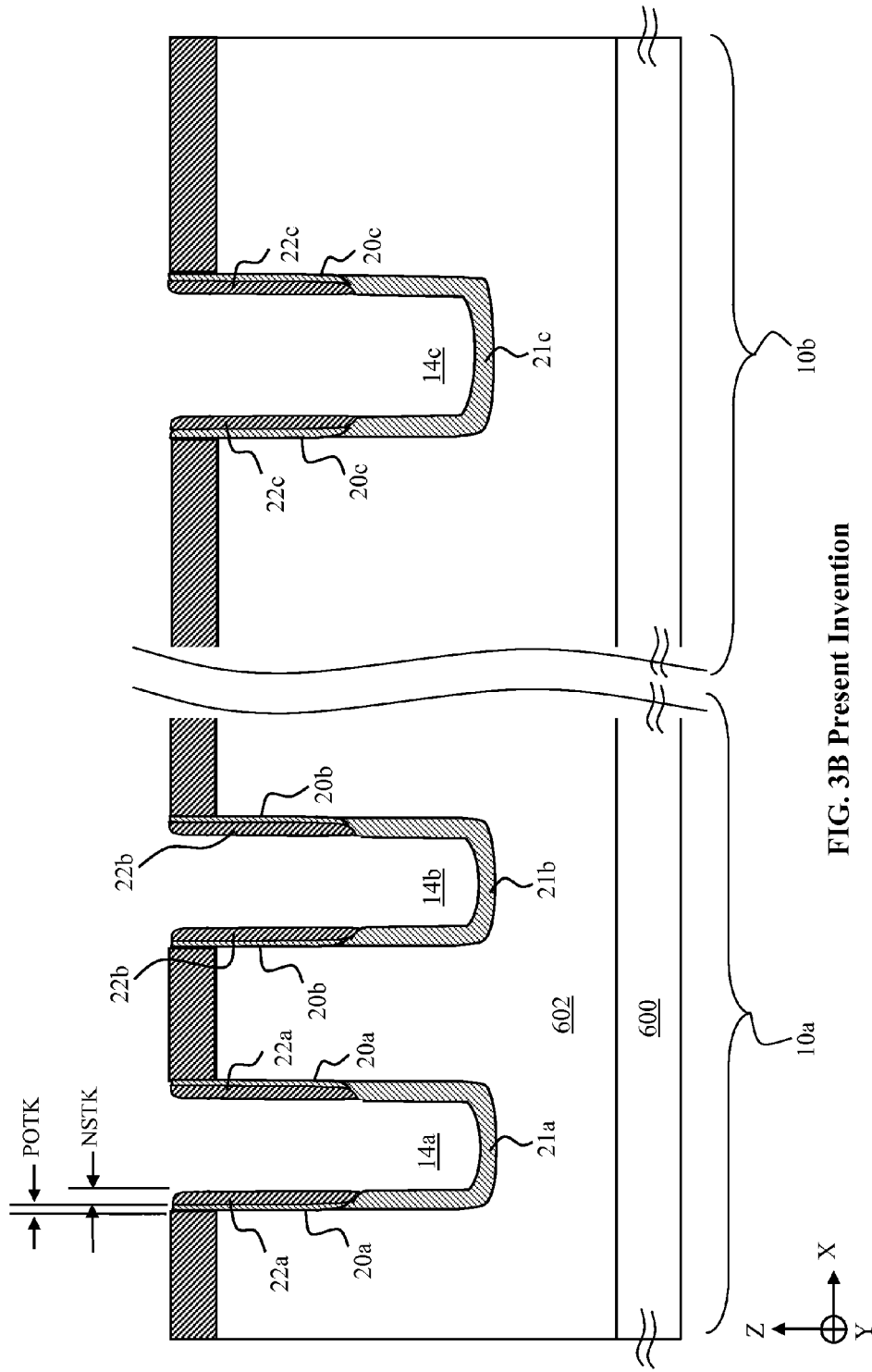
FIG. 3B Present Invention

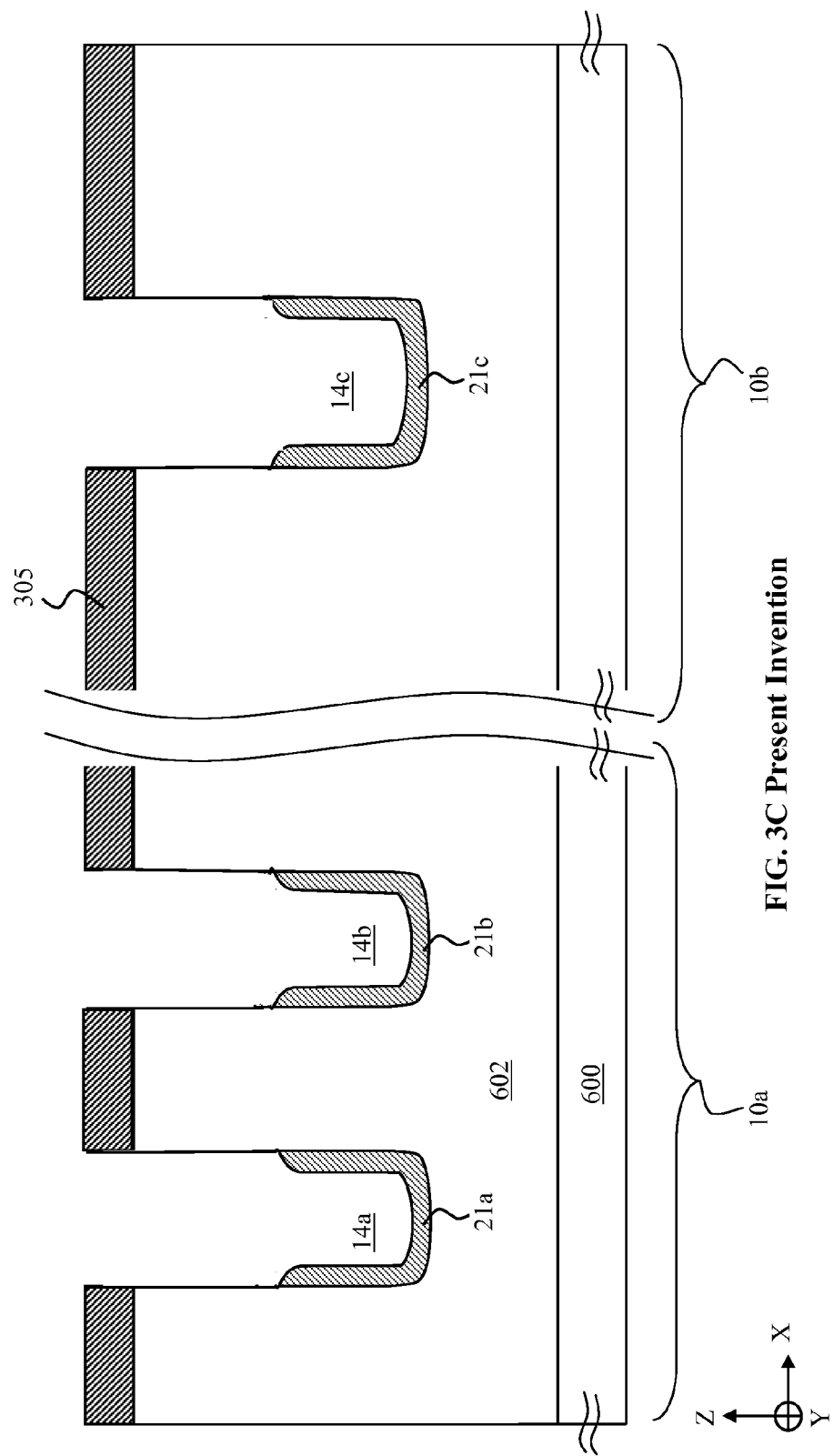
FIG. 3C Present Invention

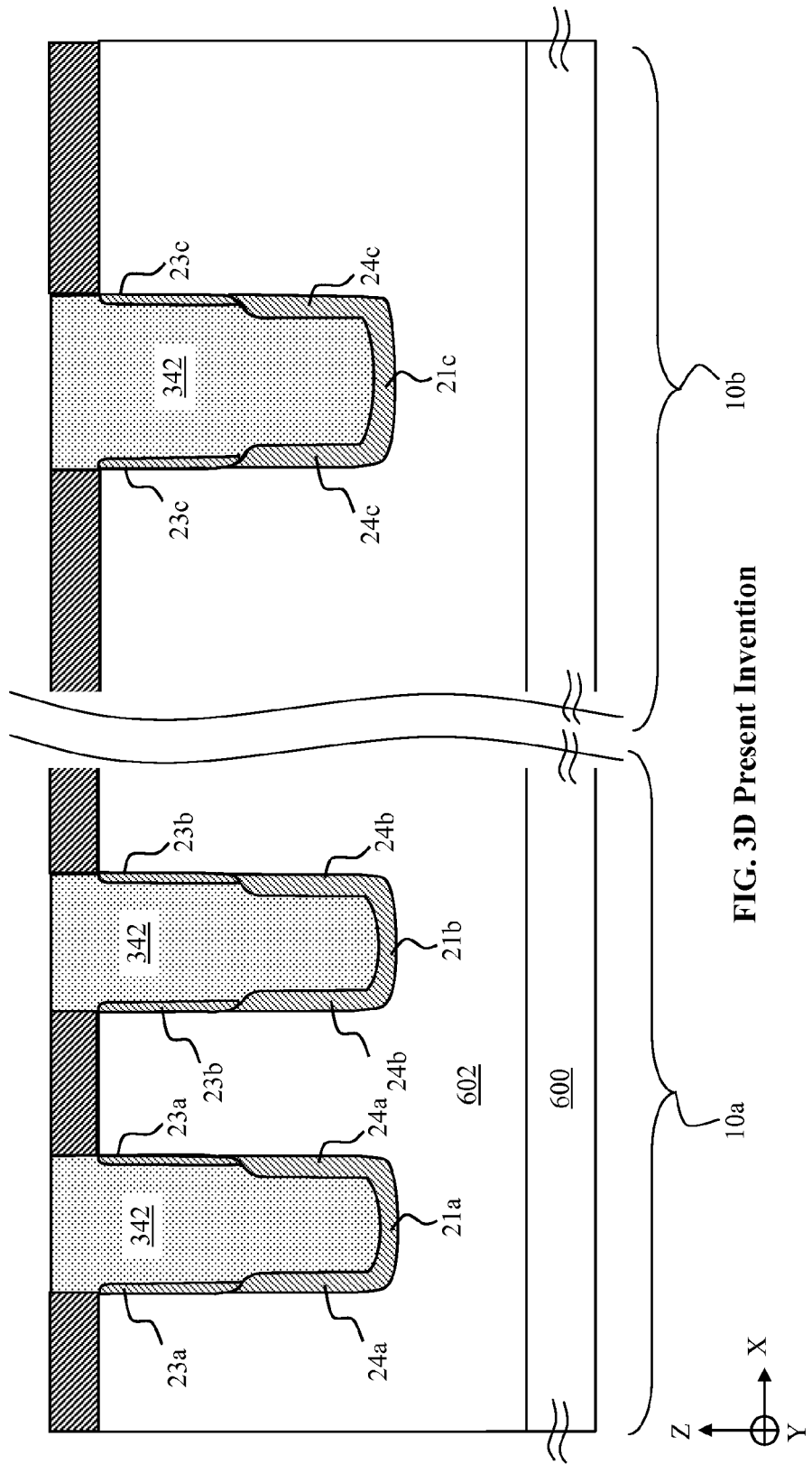
FIG. 3D Present Invention

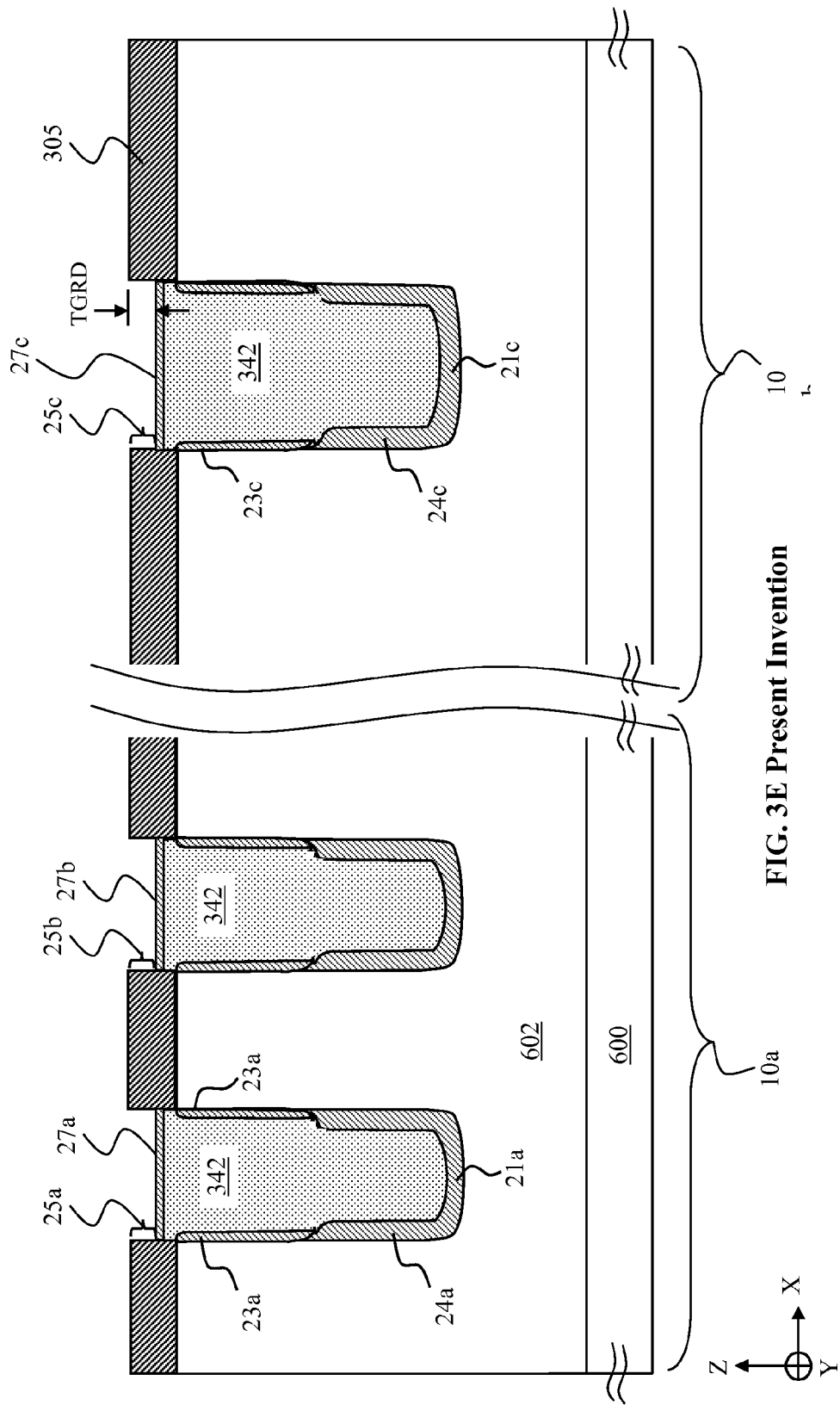
FIG. 3E Present Invention

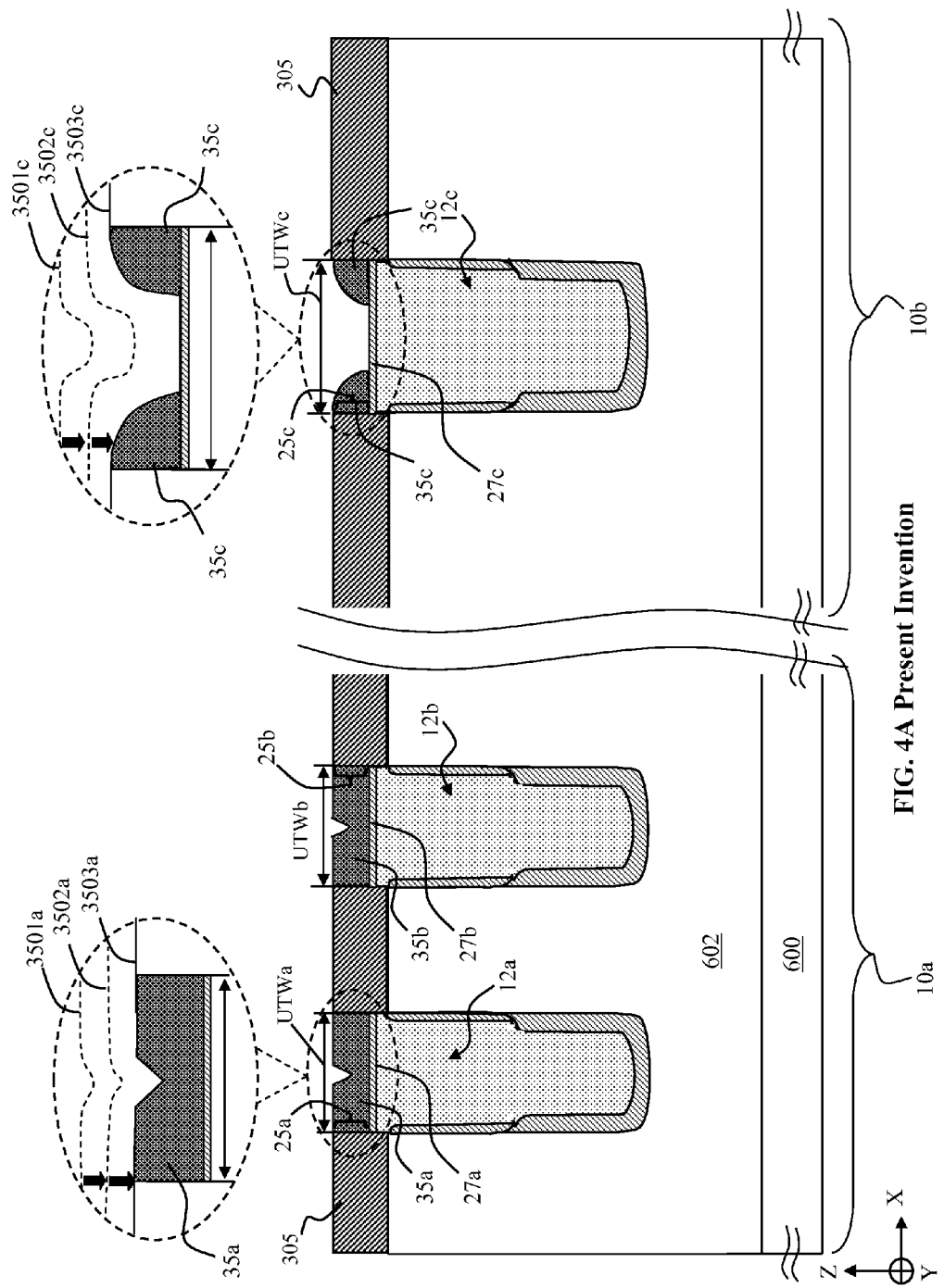
FIG. 4A Present Invention

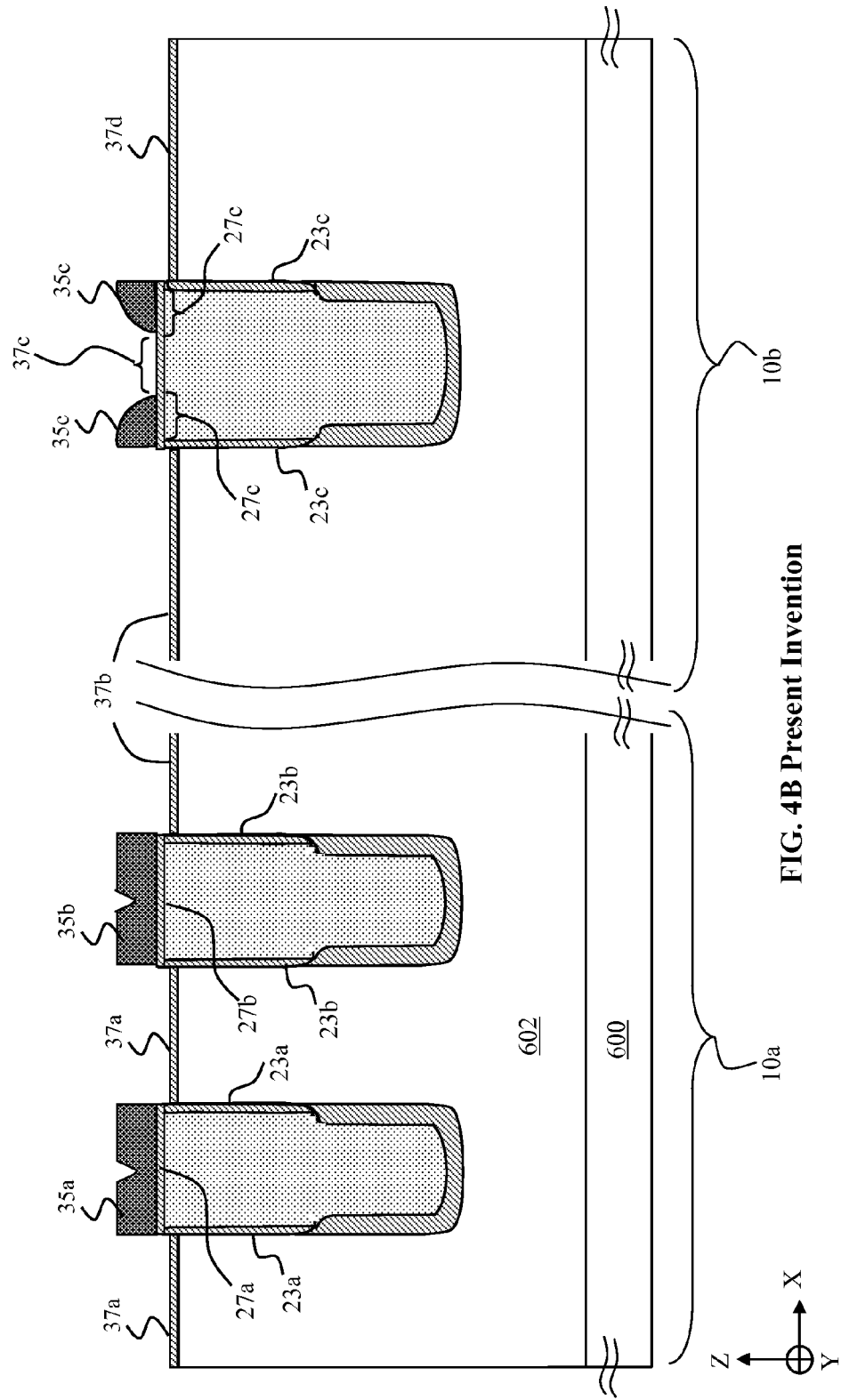
FIG. 4B Present Invention

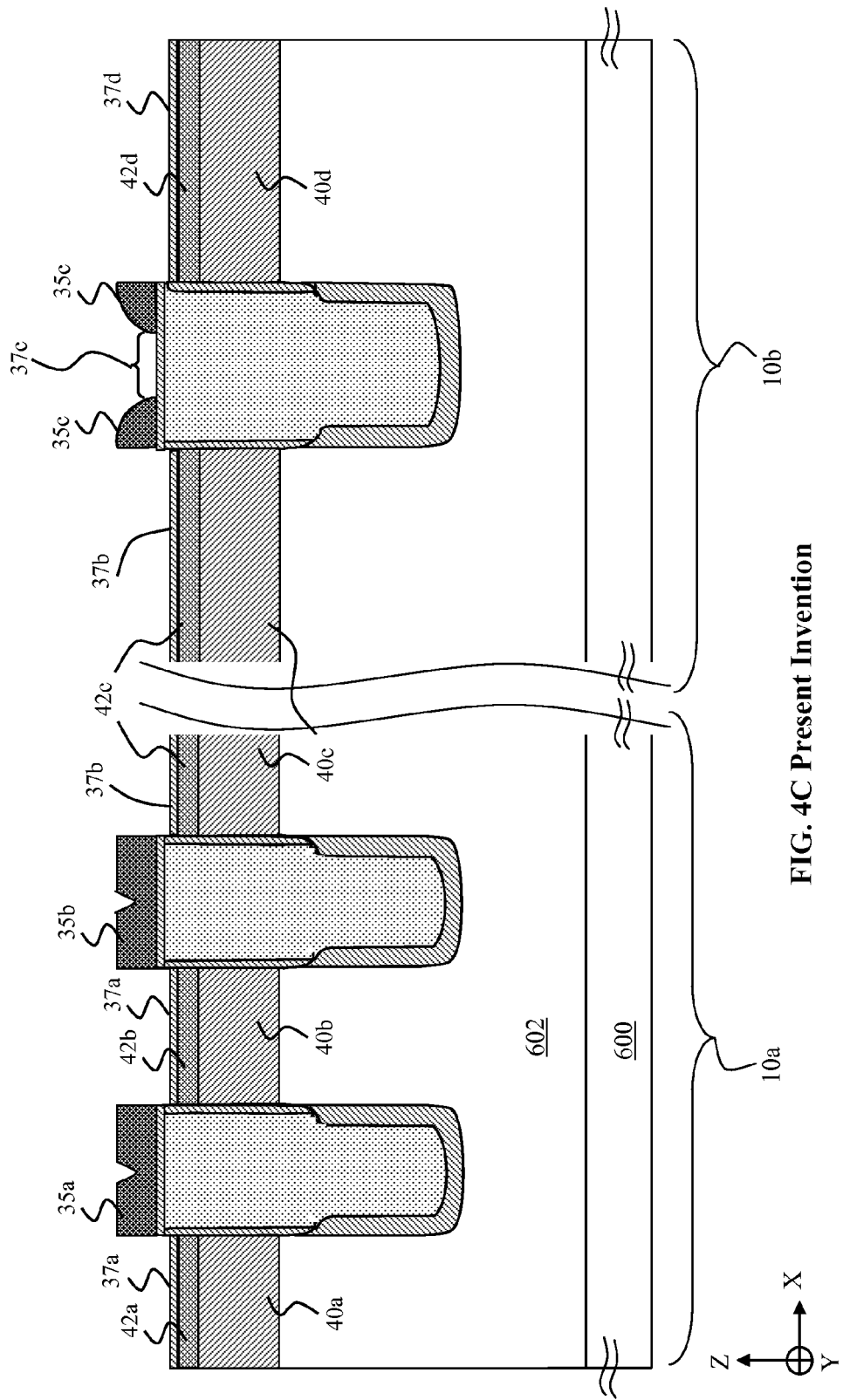
FIG. 4C Present Invention

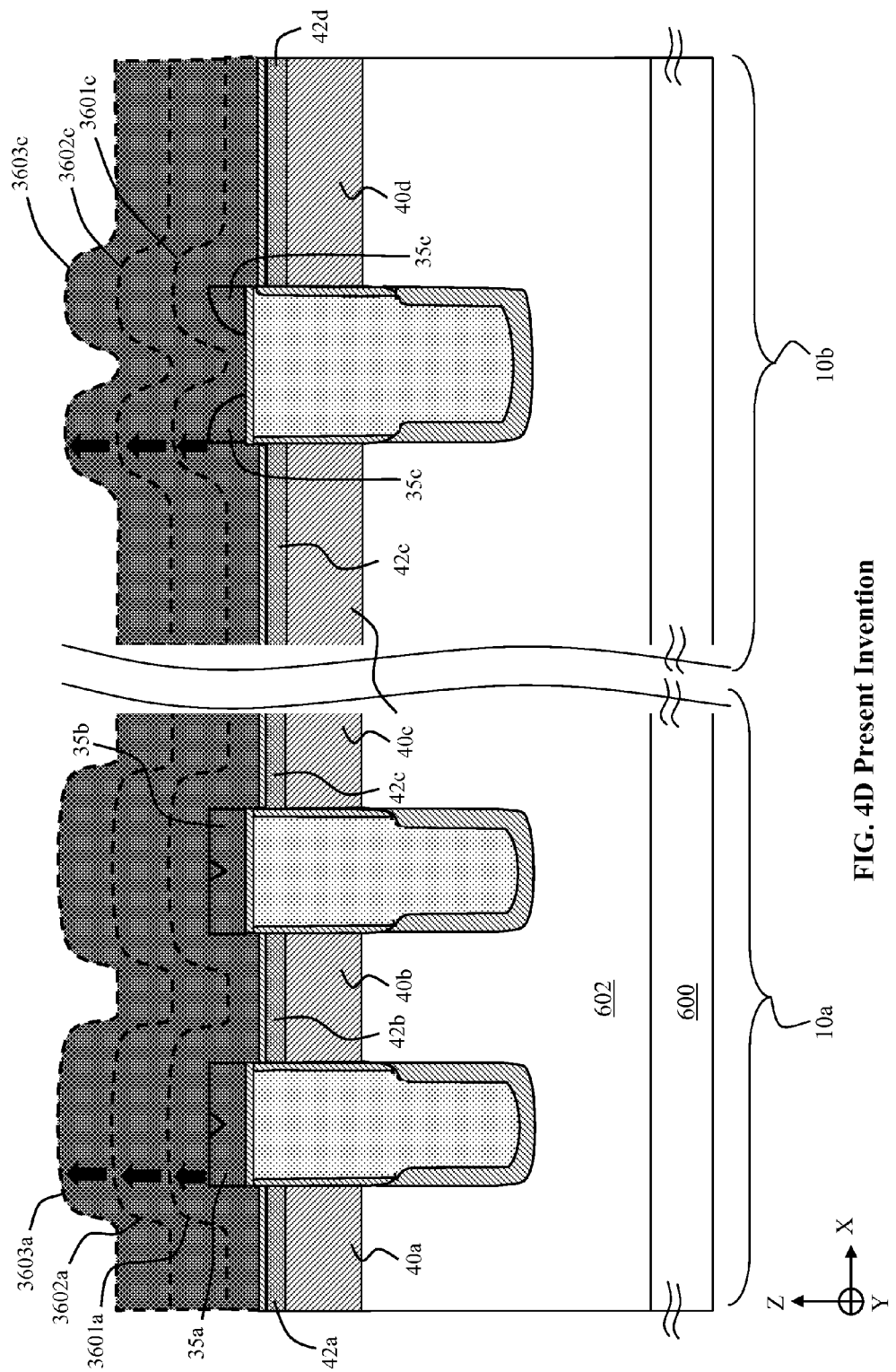
FIG. 4D Present Invention

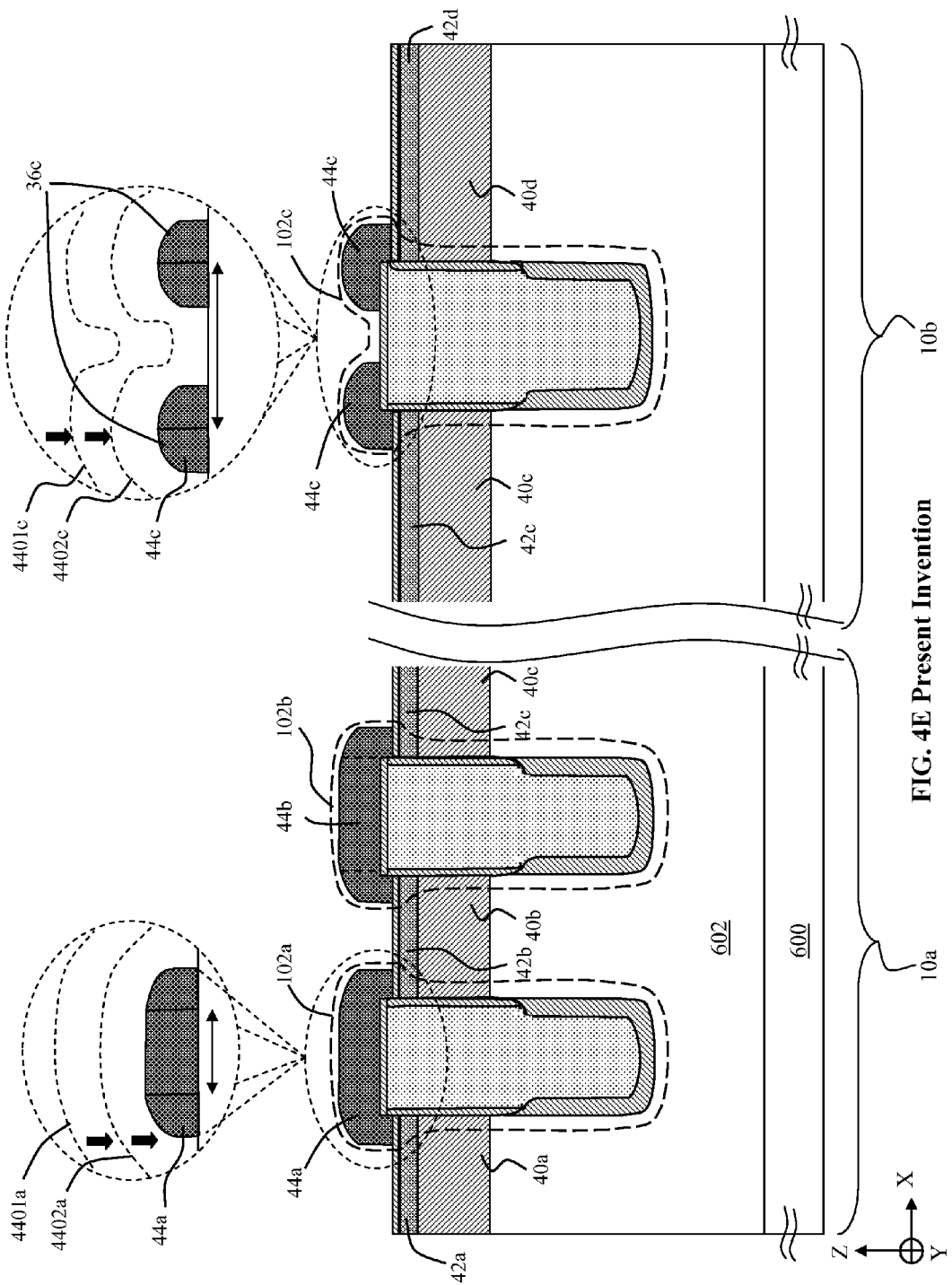
FIG. 4E Present Invention

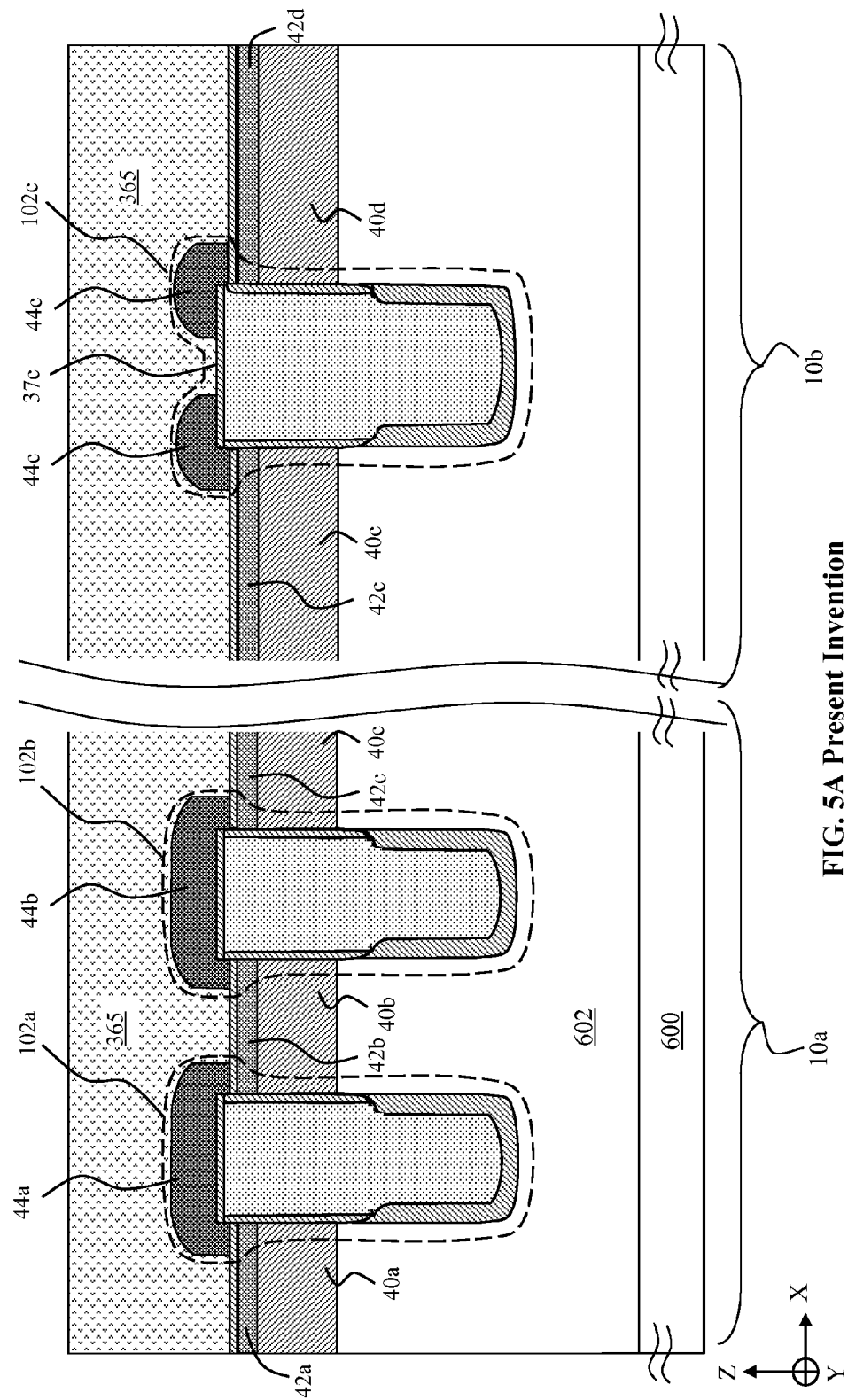
FIG. 5A Present Invention

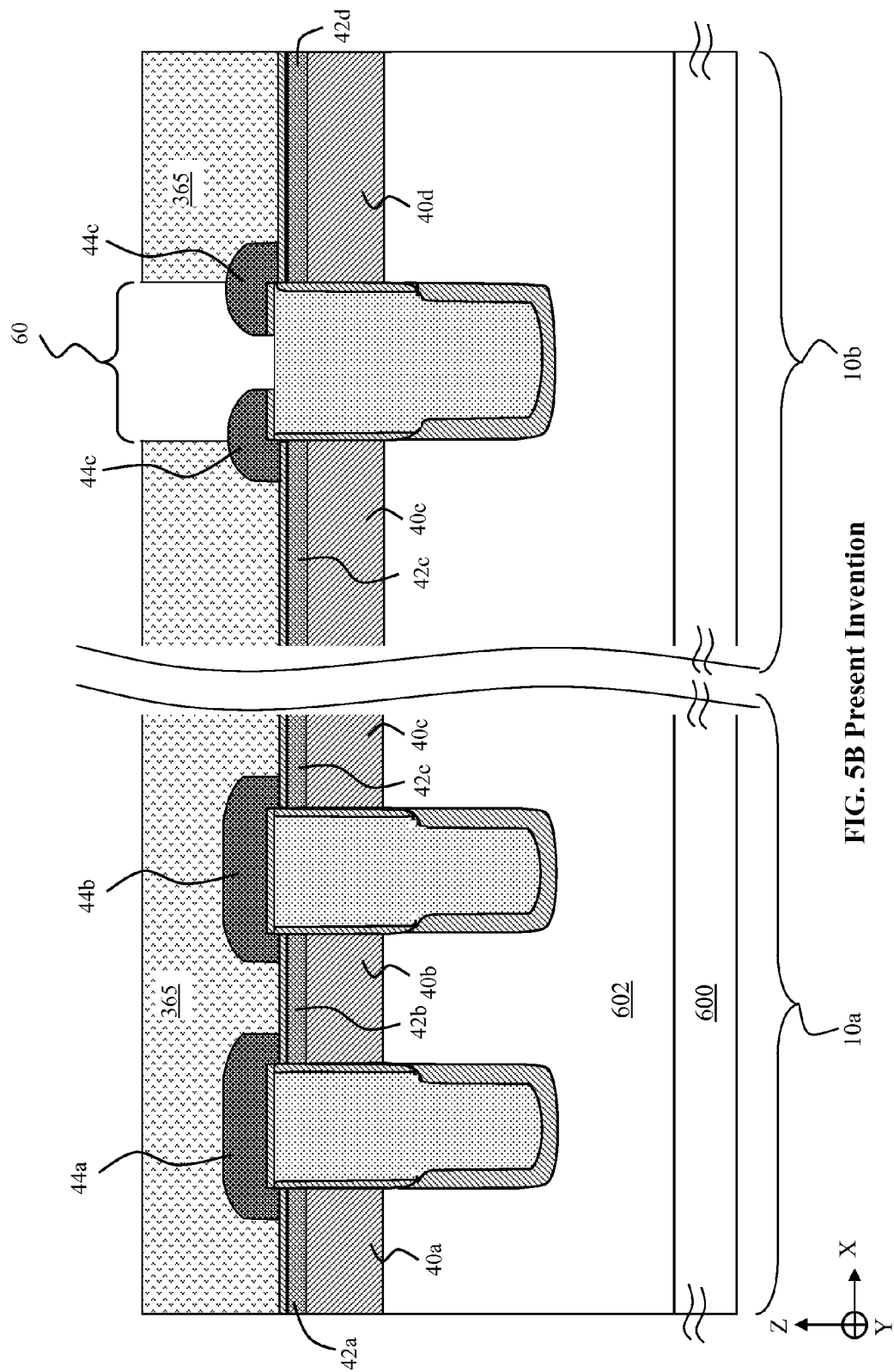
FIG. 5B Present Invention

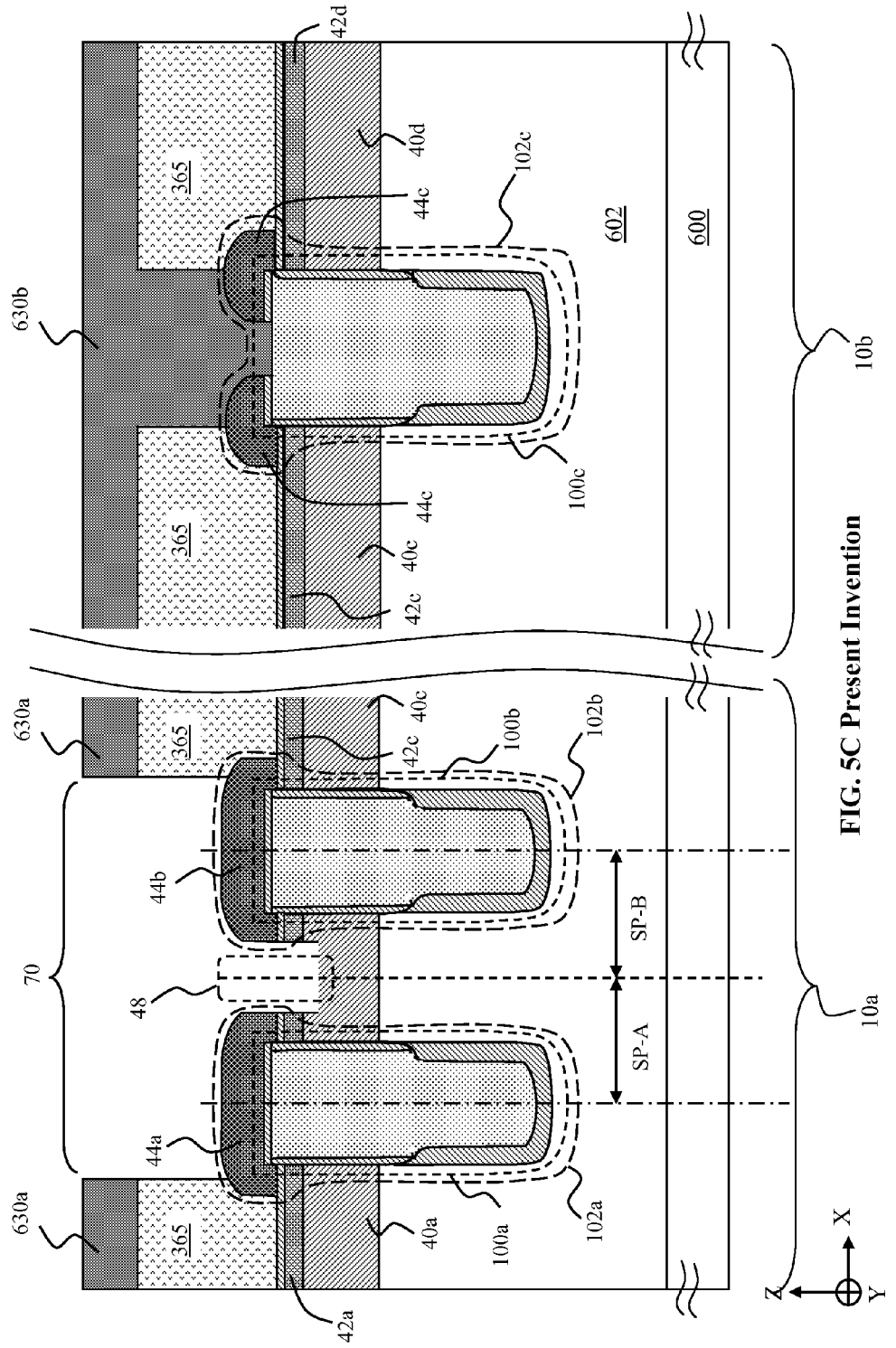
FIG. 5C Present Invention

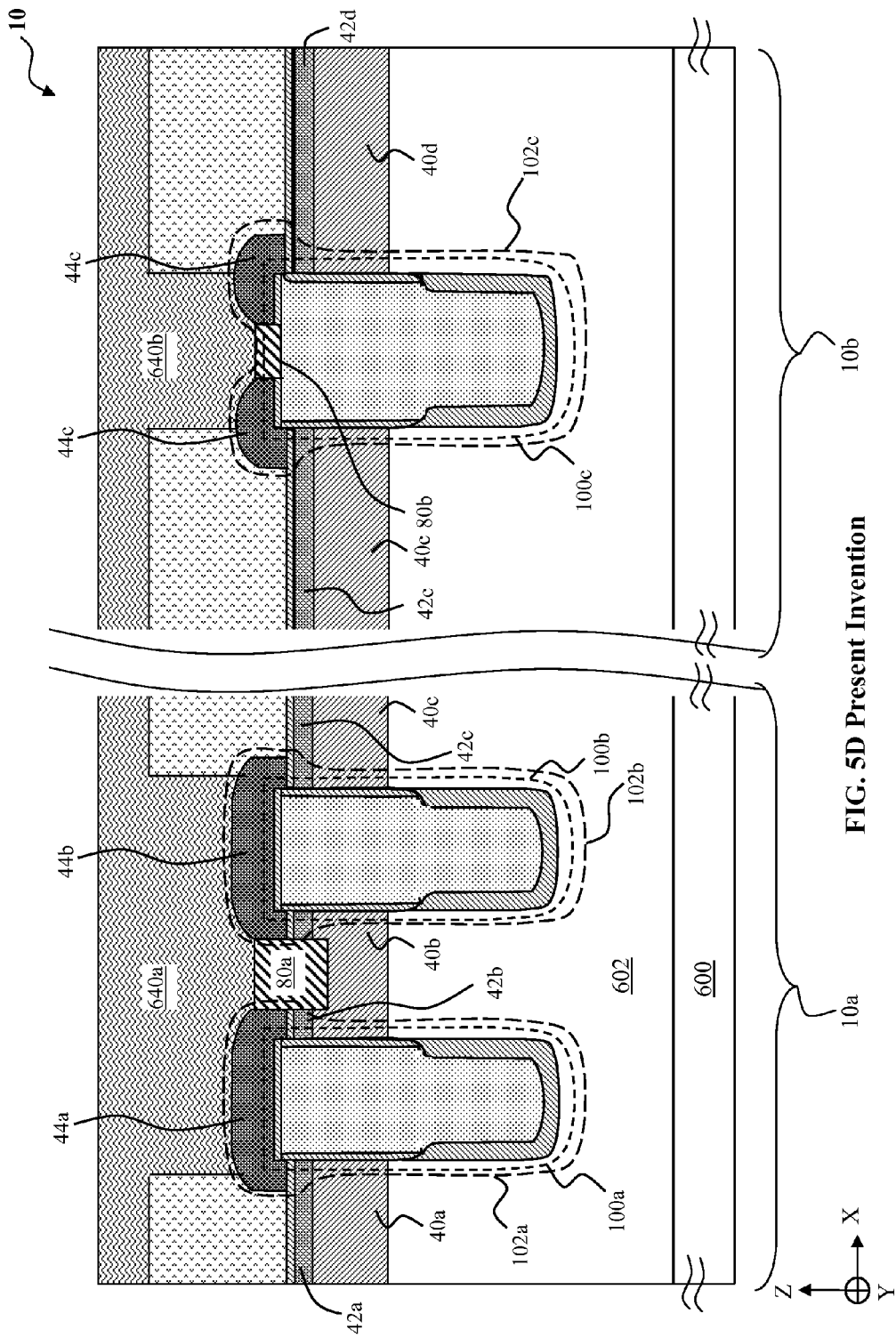
FIG. 5D Present Invention

HIGH DENSITY MOSFET ARRAY WITH SELF-ALIGNED CONTACTS DELIMITED BY NITRIDE-CAPPED TRENCH GATE STACKS AND METHOD

FIELD OF INVENTION

This invention relates generally to the field of semiconductor device structure. More specifically, the present invention is directed to device structure of a high density MOSFET array and its manufacturing method.

BACKGROUND OF THE INVENTION

Low voltage power MOSFETs are often used in load switching applications. In load switching applications it is desirable to reduce the on-resistance ($R_{ds}$) of the device. Specifically, the $R_{dsA}$ of the device needs to be minimized, where $R_{dsA}$ is the on-resistance of the device multiplied by the active area of the device. Additionally, low voltage power MOSFETs are commonly used in high frequency DC-DC conversion applications. In these applications it is often desirable to maximize the device's switching speed. Three of the most important parameters for optimizing the switching speed are: 1) $R_{ds} \times Q_g$; 2) $R_{ds} \times Q_{OSS}$; and 3) the ratio of $Q_{gd}/Q_{gs}$. First, the product of the $R_{ds}$ and the gate charge ($Q_g$) is a measure of the device conduction and switching losses together. $Q_g$ is the sum of the gate to drain charge ($Q_{gd}$) and the gate to source charge ($Q_{gs}$). In the second parameter, $Q_{OSS}$ is a measure of the capacitances that need to be charged and discharged whenever the device is switched on or off. Finally, minimizing the ratio of $Q_{gd}/Q_{gs}$ reduces the possibility of the device turning on due to a large dV/dt when the device is being switched off.

Trench based MOSFETs were designed in part in order to reduce $R_{dsA}$ of the device. The design of trench based MOSFETs allowed for the removal of the JFET structure that was present in planar MOSFETs. By eliminating the JFET, the cell pitch could be reduced. However, the basic trench based MOSFET does not have any charge balancing in the body regions, and therefore causes an increase in the $R_{dsA}$. Also, the relatively thin gate oxide generates a high electric field under the trench, which leads to a lower breakdown voltage. Low doping concentrations are needed in the drift region in order to support the voltage, and this increases the $R_{dsA}$ for structures with thinner gate oxides. Further, as cell pitch continues to decrease for high device integration density, the trench based MOSFET may become a less desirable choice because of the difficulty in reducing the thickness of the gate oxide further.

Trench based MOSFETs with two-step gate oxide with a thin layer of oxide near the top of the gate and a thicker layer of oxide in the bottom portion of the gate were designed in order to create a device that has a low channel resistance and a low drift resistance. The thin upper portion of the gate oxide provides good coupling between the gate and body region which generates a strong inversion and low on-resistance in a channel next to the thin upper portion. The thicker gate oxide on the bottom creates a charge balancing effect and allows for the drift region to have an increased doping concentration. A higher doping concentration in the drift region decreases its resistance. However, this device is not easily downwards scalable because it is highly susceptible to body contact misalignment errors. For example, if the pitch of the devices was scaled to the deep sub-micron level e.g., 0.5-0.6 µm, then the contact mask misalignment, relative to the gate, may greatly alter the characteristics of the device. In order to provide a good ohmic contact to the body region, an ohmic contact that is highly doped with dopants of the same conductivity type as the body region may be implanted after the contact mask has been used. If the contact mask is aligned too close to the gate, namely not landing exactly at the center of the silicon mesa, then highly doped implants used to generate an ohmic contact with the body may end up in the channel. If the highly doped ohmic region is in the channel, then the threshold voltage and the on-resistance of the device will be impacted. Also, if the contact mask is aligned too far away from the gate, then the turn on of the bipolar junction transistor (BJT) becomes an issue. Since the contact is further away from the trench, the length of the body region is increased and therefore so is its resistance. As the resistance of the body region increases, it increases the voltage drop across the body region. The larger voltage drop across the body region will make it easier for the parasitic BJT to turn on and ruin the device.

Therefore, in order to fabricate power MOSFET devices with a deep sub-micron pitch that are optimized for use as load switches and high frequency DC-DC applications there is a need for a device and method capable of self-aligning the contacts to the gate in order to prevent the aforementioned side effects.

BRIEF DESCRIPTION OF THE DRAWINGS

To describe numerous embodiments of the present invention, reference is made to the accompanying drawings. However, these drawings are not to be considered limitations in the scope of the invention, but are merely illustrative.

FIG. 1 illustrates a plane cross sectional view of a high density trench-gated MOSFET array of the present invention;

FIG. 2A, FIG. 2B, FIG. 2C and FIG. 3A illustrate the creation of active trenches in a MOSFET array area and a pickup trench in a gate pickup area of a semiconductor substrate;

FIG. 3B, FIG. 3C and FIG. 3D illustrate the creation, into the active trenches and the pickup trench, of numerous polysilicon trench gates each embedded in a gate oxide shell;

FIG. 3E, FIG. 4A, FIG. 4B, FIG. 4C, FIG. 4D, FIG. 4E illustrate the creation of an array of active nitride-capped trench gate stacks upon the active trenches, a pickup nitride-capped trench gate stack upon the pickup trench and successive implantation of body regions and source regions hence forming a MOSFET array in the MOSFET array area and a gate pickup structure in the gate pickup area; and FIG. 5A, FIG. 5B, FIG. 5C and FIG. 5D illustrate the deposition and patterning of dielectric regions atop the MOSFET array and the gate pickup structure and a metal layer atop the dielectric regions.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1 illustrates a plane cross sectional view of a high density trench-gated MOSFET array 10 of the present invention. To facilitate description of spatial, structural relationships within the MOSFET array 10, an X-Y-Z Cartesian coordinate system with the X-Y plane parallel to the major semiconductor chip plane is employed. The high density trench-gated MOSFET array 10 has:

(1) A semiconductor substrate 600 lying parallel to the X-Y plane and the semiconductor substrate 600 is partitioned, in the X-Y plane, into a MOSFET array area 10a and a gate pick-up area 10b.

(2) An epitaxial region 602 overlaying the semiconductor substrate 600, body implant regions 40a, 40b, 40c, 40d overlying the epitaxial region 602 and source implant regions 42a, 42b, 42c, 42d overlying the respective body implant regions 40a, 40b, 40c, 40d.

(3) An array of active nitride-capped trench gate stacks (ANCTGS) 102a, 102b plus a pickup nitride-capped trench gate stack (PNCTGS) 102c disposed at the top portion of the semiconductor substrate 600 and embedded vertically into the set of source regions 42a, 42b, . . . 42a, 42d, the set of body regions 40a, 40b, 40c, 40d and the epitaxial region 602. While only two ANCTGS are illustrated here, by now for those skilled in the art the number of ANCTGS can be extended to more than two. Similarly, the number of PNCTGS can be extended to more than one. Importantly, the ANCTGS has predetermined inter-ANCTGS separations in the X-Y plane enabling the formation of the high density trench-gated MOSFET array 10 and this will be presently illustrated with more details. As for more structural detail, the ANCTGS 102a comprises a stack of:

(3a) A trench gate stack 100a having a poly-silicon trench gate 342 embedded in a gate oxide shell (upper gate oxide 23a and lower gate oxide 24a) and a gate oxidation 27a on top.

(3b) A silicon nitride cap 44a covering the top of poly-silicon trench gate 342. Importantly, the silicon nitride cap 44a is laterally registered, in the X-Y plane, to the gate oxide shell (upper gate oxide 23a and lower gate oxide 24a) such that in Z direction center lines of the silicon nitride caps 44a and 44b are substantially overlapping with center lines of corresponding gate oxide shell. In general, a width of the silicon nitride caps 44a and 44b is slightly larger than a width of a trench the gate lined with the gate oxide shell embedded in such that the nitride caps 44a and 44b extend beyond edges of the gate oxide shell to a controlled distance, e.g. between 0.02 to 0.2 micron depending on the cell density requirement.

Therefore, the ANCTGS 102a forms, together with the source regions 42a, 42b, the body regions 40a, 40b, and the epitaxial region 602, a MOSFET device in the MOSFET array area 10a. Likewise, the similarly structured ANCTGS 102b (with trench gate stack 100b, poly-silicon trench gate 342, upper gate oxide 23b, lower gate oxide 24b, gate oxidation 27b, silicon nitride cap 44b) forms, together with the source regions 42b, 42c, the body regions 40b, 40c, and the epitaxial region 602, another MOSFET device in the MOSFET array area 10a. As a feature of the high density trench-gated MOSFET array 10, the poly-silicon trench gate 342 has an upper trench portion and a lower trench portion and, correspondingly, the gate oxide shell has an upper gate oxide 23a and a lower gate oxide 24a with thickness of the lower gate oxide 24a made larger than that of the upper gate oxide 23a. To those skilled in the art, this results in a desired reduction of gate-to-drain capacitance of the related MOSFET. In an alternative embodiment not shown here, the lower gate oxide 24a may be the same thickness as the upper gate oxide 23a to simplify the manufacturing process if such reduction of gate-to-drain capacitance is not required.

(4) Over both MOSFET array area 10a and gate pick-up area 10b, a patterned dielectric region 365 is formed atop the MOSFET array and a patterned metal layer 640a, 640b is formed atop the patterned dielectric region 365. Therefore, the patterned metal layer 640a, 640b forms, with the MOSFET array, self-aligned source and body contacts through the inter-ANCTGS separations.

(5) As for more structural detail, the PNCTGS 102c in the gate pick-up area 10b comprises a stack of:

(5a) A trench gate stack 100c having a poly-silicon trench gate 342 embedded in a gate oxide shell (upper gate oxide 23c and lower gate oxide 24c) and a gate oxidation 27c on top. The polysilicon trench gate 342 of the PNCTGS 102c is routed, along an X-Y plane, to join the polysilicon trench gates 342 of the ANCTGS 102a and 102b.

(5b) A pair silicon nitride cap 44c covering the top of poly-silicon trench gate 342. Except for its center gap, the pair silicon nitride cap 44c covers the top of polysilicon trench gate 342. Importantly, the center gap of the pair silicon nitride cap 44c is laterally registered, in the X-Y plane, to the gate oxide shell (upper gate oxide 23c and lower gate oxide 24c).

Therefore, the patterned metal layer 640b forms, through the center gap of the pair silicon nitride cap 44c, a self-aligned gate contact to the top of polysilicon trench gate 342.

As an artifact throughout the MOSFET array area 10a of the high density trench-gated MOSFET array 10, a pad oxide region 37a has been formed atop the source regions 42a, 42b but beneath the silicon nitride caps 44a, 44b. Similarly, as another artifact throughout the gate pick-up area 10b of the high density trench-gated MOSFET array 10, a pad oxide region 37b has been formed atop the source regions 42c, 42d but beneath the pair silicon nitride cap 44c. More remarks on these artifacts 37a, 37b will be given later.

As another feature of the high density trench-gated MOSFET array 10, at the contact interface between the patterned metal layer 640a and the source and body contact, a contact enhancement plug 80a can be added for improving the quality and reliability of the contact interface. Similarly, at the contact interface between the patterned metal layer 640b and the PNCTGS 102c, a contact enhancement plug 80b can be added for improving the quality and reliability of the contact interface as well. For example, the contact enhancement plugs 80a and 80b can be made of tungsten (W). As shown in FIG. 1, conductive materials filling a gate contact hole for electrically connect to the gate region. The gate contact hole includes a wide opening through the dielectric layer 365 above the pair silicon nitride cap 44c exposing at least portion of the of pair silicon nitride cap 44c and the gap between the pair silicon nitride cap. The gate contact hole further includes a narrow opening in the gap of pair silicon nitride cap 44c. The contact enhancement plug 80b fills at least a bottom portion of the narrow opening with a width of the gap of the pair silicon nitride cap and the patterned metal layer 640b fills a top portion of the narrow opening and the entire wide opening.

FIG. 2A through FIG. 5D illustrate the processing steps for making the high density trench-gated MOSFET array 10 of the present invention. FIG. 2A, FIG. 2B, FIG. 2C and FIG. 3A illustrate the creation of active trenches in a MOSFET array area and a pickup trench in a gate pickup area of a semiconductor substrate.

FIG. 2A illustrates the formation of an epitaxial region 602 (for example of an N− conductivity type) upon a semiconductor substrate 600 (for example of an N+ conductivity type) then partitioning the device in progress, along its top X-Y plane, into a MOSFET array area 10a and a gate pick-up area 10b. A hard oxide mask 304 made of silicon dioxide is then deposited atop the device in progress.

In FIG. 2B the hard oxide mask 304 is photolithographically patterned into a patterned hard mask 305 according to a pre-determined cross sectional trench top geometry (X-Y plane) of upper active trenches in the MOSFET array area 10a and a pre-determined cross sectional trench top geometry (X-Y plane) of pickup trench in the gate pick-up area 10b.

FIG. 2C through FIG. 3A illustrate the creation of an array of active trenches in the MOSFET array area 10a and a pickup trench in the gate pick-up area 10b with the active trenches and the pickup trench extending a predetermined total trench depth TCD partially into the epitaxial region 602. In FIG. 2C upper trenches 12a, 12b, 12c with an upper trench width (UTW$_a$, UTW$_b$, UTW$_c$) and an upper trench depth (UTD) are anisotropically etched out through the patterned hard mask 305. The UTD is achieved with pre-determined etching rate and etching time. As an important remark, the width (UTW$_c$) of pickup trench 12c is made substantially wider than those (UTW$_a$, UTW$_b$) of the active trenches 12a, 12b such that in following nitride cap formation steps, a gap of minimum width is provided for metal contact to the gate. For example, UTW$_c$ may be as wide as two times of UTW$_a$. In a preferred embodiment UTW$_a$ is selected between 0.2 to 0.6 micron and UTW$_c$ is 0.4 micron or larger. In FIG. 3A pad oxide layer 20a, 20b, 20c, of thickness POTK, are grown atop the silicon surface at the sidewall and bottom of the upper trenches 12a, 12b, 12c. A thin nitride spacer layer 22a, 22b, 22c, of thickness NSTK, is then formed upon the pad oxide layer 20a, 20b, 20c. Next, the bottom portion of the nitride spacer layer 22a, 22b, 22c and the pad oxide layer 20a, 20b, 20c are anisotropically etched out to expose the bottom of the upper trenches 12a, 12b, 12c. Lower trenches 14a, 14b, 14c can then be anisotropically etched out into the epitaxial region 602, through the exposed bottom of the upper trenches 12a, 12b, 12c. As a result, the lower trenches 14a, 14b, 14c have a lower trench width (LTW$_a$, LTW$_b$, LTW$_c$) and a lower trench depth (LTD) with the resulting lower trench width<upper trench width. The LTD is achieved with pre-determined etching rate and etching time.

FIG. 3B through FIG. 3D illustrate the creation, into the active trenches and the pickup trench, of numerous polysilicon trench gates each embedded in a gate oxide shell. In FIG. 3B a liner oxide layer 21a, 21b, 21c is grown on the silicon surface of the lower trenches 14a, 14b, 14c with thickness of the liner oxide layer>that of the pad oxide layer 20a, 20b, 20c (POTK). In FIG. 3C the nitride spacer layer and the pad oxide layer in the upper trenches are completely removed, for example through a wet dip etching, with a corresponding reduction of the thickness of the liner oxide layer 21a, 21b, 21c in the lower trenches 14a, 14b, 14c. In FIG. 3D an upper gate oxide shell 23a, 23b, 23c is grown on the silicon surface of the upper trenches upon the device in progress resulting in a corresponding lower gate oxide shell 24a, 24b, 24c thicker than that of a corresponding upper gate oxide shell. All the trenches (12a-12c, 14a-14c) in the MOSFET array area 10a and the gate pick-up area 10b are then filled with polysilicon deposition followed by polishing top of the device in progress. This completes a poly-silicon trench gate 342 embedded in a gate oxide shell (23a, 23b, 23c and 24a, 24b, 24c). Recall that, because lower trench width (LTW$_a$, LTW$_b$, LTW$_c$)<upper trench width (UTW$_a$, UTW$_b$, UTW$_c$) it follows that the thickness of a corresponding lower gate oxide shell (24a, 24b, 24c)>that of a corresponding upper gate oxide shell (23a, 23b, 23c). To those skilled in the art, this effects a desired reduction of gate-to-drain capacitance of the related MOSFET.

FIG. 3E, FIG. 4A, FIG. 4B, FIG. 4C, FIG. 4D, FIG. 4E illustrate the creation of an array of active nitride-capped trench gate stacks upon the active trenches, a pickup nitride-capped trench gate stack upon the pickup trench and successive implantation of body regions and source regions hence forming a MOSFET array in the MOSFET array area 10a and a gate pickup structure in the gate pick-up area 10b. FIG. 3E illustrates etching, through the patterned hard mask 305, the poly-silicon trench gate 342 till a depth of trench gate recess depth (TGRD) with the TGRD less than the thickness of the patterned hard mask 305 thus creating a trench gate recess 25a, 25b, 25c. A gate oxidation layer 27a, 27b, 27c is then grown into the poly-silicon trench gate 342.

FIG. 4A illustrates the deposition then dry etching into a silicon nitride cap seed 35a, 35b, 35c upon the gate oxidation layer 27a, 27b, 27c till the silicon nitride cap seed 35a, 35b, 35c just fills up the trench gate recess 25a, 25b, 25c at the upper trenches 12a, 12b, 12c whereas, as the pickup upper trench 12c is substantially wider than those of the active upper trenches 12a, 12b (UTW$_c$>>UTW$_a$, UTW$_b$) the silicon nitride cap seed 35c only partially fills up the trench gate recess 25c at the pickup upper trench 12c around its periphery. To more clearly illustrate dry etching into the silicon nitride cap seed 35a, a number of interim, progressive dry etching surface profiles 3501a, 3502a, . . . 3503a are added in the upper left inset. Likewise, to more clearly illustrate dry etching into the silicon nitride cap seed 35c, a number of interim, progressive dry etching surface profiles 3501c, 3502c, 3503c are added in the upper right inset.

In FIG. 4B the patterned hard oxide mask 305 is stripped off thus causing the silicon nitride cap seeds 35a, 35b, 35c to protrude, with edges of protrusion in inherent registration with the upper gate oxide shell 23a, 23b, 23c, above top surface of the device in progress. Next, a pad oxide region 37a, 37b, 37c, 37d is then grown on top silicon surface of the device in progress.

FIG. 4C illustrates:
1) Implanting, with a body mask and through the pad oxide region 37a, 37b, 37c, 37d, body implant regions 40a, 40b, 40c, 40d embedded into the top portion of the epitaxial region 602 while protecting the semiconductor surface from an implantation-induced damage with the pad oxide region 37a, 37b, 37c, 37d.
2) Implanting, with a source mask and through the pad oxide region 37a, 37b, 37c, 37d, source implant regions 42a, 42b, 42c, 42d embedded into the top portion of the epitaxial region 602 and atop the body implant regions 40a, 40b, 40c, 40d while protecting the semiconductor surface from an implantation-induced damage with the pad oxide region 37a, 37b, 37c, 37d.
As a preferred embodiment, thickness of the body region may range from 0.3 micron to 0.7 micron and thickness of the source region may range from 0.1 micron to 0.2 micron. As a related remark on the pad oxide region 37a, 37b, 37c, 37d, while it serves to protect the semiconductor surface from an implantation-induced damage and from a later silicon nitride deposition step, the pad oxide region 37a, 37b, 37c, 37d does not provide any function in the finished device, so the pad oxide region 37a, 37b, 37c, 37d can optionally be removed as an artifact with another process step following the final silicon nitride deposition.

FIG. 4D and FIG. 4E illustrate subjecting the device in progress to a cycle of aerially uniform silicon nitride deposition (FIG. 4D) and silicon nitride etching (FIG. 4E), each with pre-determined deposition rate and deposition time interval. To more clearly illustrate silicon nitride deposition, a number of interim, progressive dry deposition surface profiles 3601a, 3602a, 3603a, 3601c, 3602c, 3603c are added in FIG. 4D. To more clearly illustrate silicon nitride etching, a number of interim, progressive dry etching surface profiles 4401a, 4402a, 4401c, 4402c are added as insets in FIG. 4E. Thus, owing to the protrusion of the silicon nitride cap seeds 35a, 35b, the silicon nitride cap seeds 35a, 35b are grown into silicon nitride caps 44a, 44b. Meanwhile, owing to the protrusion of the silicon nitride cap seed 35c, the silicon nitride cap seed 35c is grown into a pair silicon nitride cap 44c. To those skilled in the art, therefore, an array of active nitride-capped trench gate stacks (ANCTGS) 102a, 102b have been created in the MOSFET array area 10a and a pickup nitride-capped trench gate stack (PNCTGS) 102c has been created in the gate pick-up area 10b. Importantly, the ANCTGS has predetermined inter-ANCTGS separations in the X-Y plane enabling the formation of a high density trench-gated MOSFET array with self-alignment of source and body contacts. This is because all the silicon nitride caps 44a, 44b are laterally registered, in the X-Y plane, to their closest upper gate oxide shells. Additionally, although less important, the same process of the present invention simultaneously realizes self-alignment of gate contact in the gate pick-up area 10b.

FIG. 5A, FIG. 5B, FIG. 5C and FIG. 5D illustrate the deposition and patterning of dielectric regions atop the MOSFET array and the gate pickup structure and a metal layer atop the dielectric regions. FIG. 5A and FIG. 5B illustrate the formation and patterning of a patterned dielectric region 365 (e.g., made of reflow LTO/BPSG (low temperature oxide/borophosilicate glass)). The patterned dielectric region 365 has a gate contact opening 60 atop the PNCTGS 102c thus exposing the pad oxide region 37c beneath the center gap of the pair silicon nitride cap 44c. The exposed pad oxide region 37c is then etched away.

In FIG. 5C a patterned hard mask 630a, 630b is formed and patterned atop the device in progress. The patterned hard mask 630a, 630b has a source/body contact opening 70 directly over the ANCTGS 102a, 102b thus exposing a corresponding portion of the patterned dielectric region 365. The corresponding portion of the patterned dielectric region 365 is then etched away thus exposing a portion of the pad oxide region 37a delimited by the two silicon nitride caps 44a and 44b. The exposed delimited portion of the pad oxide region 37a is then etched away followed by anisotropic etching through the source implant region 42b and partially into the body implant region 40b thus creating a self-aligned contact opening 48 for making source and body contacts. As a result, the corresponding dimensions spacing A (SP-A), spacing B (SP-B) and MOSFET device pitch of the high density trench-gated MOSFET array 10 can be made very small.

FIG. 5D illustrates the completed high density trench-gated MOSFET array 10 following a final deposition of metal layer 640a, 640b. As another optional feature of the present invention, contact enhancement plugs 80a, 80b can be formed at the contact interface between the metal layer 640a, 640b and the source, body and gate regions, prior to the final deposition of metal layer 640a, 640b, for improving the quality and reliability of these contact interfaces. The contact enhancement plugs 80a, 80b can be made of tungsten (W). In a preferred embodiment, a thin titanium/titanium nitride (Ti/TiN) barrier metal layer is deposited followed by the deposition of tungsten (W) with thickness of the resulting contact enhancement plug ranging from 2000 to 4000 Angstrom.

While by now it should be understood that the present invention can be practiced with a large range of numerous device geometrical parameters, the following list some geometrical parameters under a preferred embodiment:

Silicon nitride cap 44a, 44b has a width of 0.3-1 micron and a thickness of 1000-5000 Angstrom resulting in a device pitch of 0.4 micron-1.2 micron in the MOSFET array. Pair silicon nitride cap 44c has a width (outer edge to outer edge) of 0.5-1.6 micron and a thickness of 1000-5000 Angstrom.

Pad oxide region 37a, 37b, 37c, 37d has a thickness of 100-300 Angstrom.

For the polysilicon trench gate 342 in the MOSFET array area 10a:

its upper trench portion has a width of 0.2 micron-0.3 micron, a depth of 0.3 micron-0.6 micron.

its lower trench portion has a depth of 0.3 micron-0.6 micron. the upper gate oxide shell has a thickness of 100-600 Angstrom while the lower gate oxide shell has a thickness of 300-1000 Angstrom.

While the description above contains many specificities, these specificities should not be construed as accordingly limiting the scope of the present invention but as merely providing illustrations of numerous presently preferred embodiments of this invention. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A method for fabricating a high density trench-gated MOSFET array device comprising:
   a) providing a semiconductor substrate, forming an epitaxial layer on the semiconductor substrate;
   b) creating an array of active trenches in a MOSFET array area and a pickup trench in a gate pickup area with the active trenches and the pickup trench extending a predetermined total trench depth (TCD) from a top surface of the epitaxial layer into the epitaxial layer;
   c) creating an array of active nitride-capped trench gate stacks (ANCTGS) upon the active trenches, a pickup nitride-capped trench gate stack (PNCTGS) upon the pickup trench, and implanting into the epitaxial layer body regions and source regions, wherein:
      the ANCTGS having predetermined inter-ANCTGS separations; and
      each ANCTGS comprises a stack of:
         a polysilicon trench gate embedded in a gate oxide shell; and
         a silicon nitride cap covering the top of the polysilicon trench gate and registered, along a horizontal direction, to the gate oxide shell;
   and wherein the PNCTGS comprises a stack of:
      a polysilicon trench gate embedded in a gate oxide shell; and a pair of silicon nitride caps comprising a center gap registered, along a horizontal direction, to the gate oxide shell, said pair of silicon nitride caps covers, except for the center gap, the top of the polysilicon trench gate thereby forming a MOSFET array in the MOSFET array area and a gate pickup structure in the gate pickup area; and d) depositing a patterned dielectric region atop the MOSFET array and the gate pickup structure and a patterned metal layer atop the patterned dielectric region wherein the patterned metal layer forms a number of self-aligned source and body contacts through the inter-ANCTGS separations in the MOSFET array area and a self-aligned gate contact through the center gap between said pair silicon nitride caps in the gate pickup structure area; and wherein creating the array of active nitride-capped trench gate stacks (ANCTGS) upon the active trenches, and the pickup nitride-capped trench gate stack (PNCTGS) upon the pickup trench further comprises:

Forming a polysilicon gate recess inside each active trench and the pickup trench from a top surface of a hard mask;

Depositing then dry etching a silicon nitride layer to form a silicon nitride cap seed that just fills up the gate recess in each active trench and only partially fills up the gate recess in the pickup trench;

Stripping of the hard mask then depositing and dry etching a second silicon nitride layer to form a silicon nitride cap on top of each active trench gate and a pair silicon nitride cap on top of the pickup trench gate.

2. The method of claim 1 wherein creating the active trenches and the pickup trench comprise:

making a width of the pickup trench substantially wider than those of the active trenches; and making all trenches in active area with the same TCD but each sectioned into an upper trench and a lower trench with the width of upper trench larger than the width of lower trench resulting in the thickness of a corresponding lower gate oxide shell larger than that of a corresponding upper gate oxide shell whereby effecting a desired reduction of gate-to-drain capacitance of the related MOSFET.

3. The method of claim 2 wherein the width of pickup trench is at least two times those of the active trenches.

4. A method for fabricating a high density trench-gated MOSFET array device comprising:

a) providing a semiconductor substrate, forming an epitaxial layer on the semiconductor substrate;

b) creating an array of active trenches in a MOSFET array area and a pickup trench in a gate pickup area with the active trenches and the pickup trench extending a predetermined total trench depth (TCD) from a top surface of the epitaxial layer into the epitaxial layer;

c) creating an array of active nitride-capped trench gate stacks (ANCTGS) upon the active trenches, a pickup nitride-capped trench gate stack (PNCTGS) upon the pickup trench, and implanting into the epitaxial layer body regions and source regions, wherein:

the ANCTGS having predetermined inter-ANCTGS separations; and each ANCTGS and the PNCTGS comprises a stack of:
a polysilicon trench gate embedded in a gate oxide shell; and
a silicon nitride cap covering a top of the polysilicon trench gate and registered, along a horizontal direction, to the gate oxide shell thereby forming a MOSFET array in the MOSFET array area and a gate pickup structure in the gate pickup area; and d) depositing a patterned dielectric region atop the MOSFET array and the gate pickup structure and a patterned metal layer atop the patterned dielectric region;

wherein creating the active trenches and the pickup trench further comprise:

making a width of the pickup trench substantially wider than those of the active trenches; and making all trenches in active area with the same TCD but each sectioned into an upper trench and a lower trench with the width of upper trench larger than the width of lower trench resulting in the thickness of a corresponding lower gate oxide shell larger than that of a corresponding upper gate oxide shell whereby effecting a desired reduction of gate-to-drain capacitance of the related MOSFET;

wherein creating the active trenches and the pickup trench with the thickness of a corresponding lower gate oxide shell larger than that of a corresponding upper gate oxide shell further comprise:

depositing and patterning, according to the upper trench cross sectional geometry of the active trenches and the pickup trench, a hard oxide mask upon the device;

anisotropically etching out, through the patterned hard oxide mask, the upper trenches with an upper trench width and an upper trench depth;

growing a pad oxide layer atop the upper trenches and forming a nitride spacer layer upon the pad oxide layer;

anisotropically etching out the bottom portion of the nitride spacer layer and the pad oxide layer thus exposing the bottom of the upper trenches;

anisotropically etching out, through the exposed bottom of the upper trenches, the lower trenches with a lower trench width and a lower trench depth with the resulting lower trench width less than upper trench width;

growing a liner oxide layer, with thickness larger than that of the pad oxide layer, into the lower trenches;

completely removing the nitride spacer layer and the pad oxide layer in the upper trenches while correspondingly reducing the thickness of the liner oxide payer in the lower trenches;

growing a gate oxide layer upon the device resulting in a corresponding lower gate oxide shell thicker than that of a corresponding upper gate oxide shell; and filling the active trenches and the pickup trench with polysilicon deposition then polishing top of the device thereby completing a polysilicon trench gate embedded in a gate oxide shell.

5. The method of claim 4 wherein creating an array of ANCTGS upon the active trenches and a PNCTGS upon the pickup trench comprise:

etching, through the patterned hard oxide mask, the polysilicon trench gate till a depth of trench gate recess depth (TGRD) being less than that of the hard oxide mask thus creating a trench gate recess;

growing a gate oxidation layer into the polysilicon trench gate; and creating, atop each of the polysilicon trench gate, a silicon nitride cap covering the top of polysilicon trench gate and laterally registered, along a horizontal direction, to the gate oxide shell.

6. The method of claim 5 wherein creating the ANCTGS upon the active trenches, the PNCTGS upon the pickup trench and implanting the source regions and body regions comprise:

a) depositing then dry etching a silicon nitride cap seed upon the gate oxidation layer atop both active trenches and pickup trench till the silicon nitride cap seed just fills up the trench gate recess at the active trenches whereas, as the pickup trench is substantially wider than those of the active trenches, the silicon nitride cap seed only partially fills up the trench gate recess at the pickup trench around its periphery;

b) stripping off the patterned hard oxide mask thus causing the silicon nitride cap seed to protrude, with edges of protrusion in inherent registration with the gate oxide shell, above top surface of the device in progress then etching off the gate oxidation layer exposed through the silicon nitride cap seed;

c) growing a pad oxide region into top surface of the device in progress;

d) implanting, with a body mask and through the pad oxide region, body implant regions embedded inside the epitaxial layer while protecting the semiconductor surface from an implantation-induced damage with the pad oxide region;

e) implanting, with a source mask and through the pad oxide region, source implant regions embedded inside the epitaxial layer and atop the body implant regions while protecting the semiconductor surface from an implantation-induced damage with the pad oxide region; and f) subjecting the device in progress to a cycle of aerially uniform silicon nitride deposition and silicon nitride etching, each with pre-determined process rate and process time interval, thus, owing to the protrusion of the silicon nitride cap seed, growing the silicon nitride cap seed into the silicon nitride cap and completing:

f1) the ANCTGS upon the active trenches with the ANCTGS having predetermined inter-ANCTGS separations; and f2) the PNCTGS upon the pickup trench.

7. The method of claim 1 wherein depositing and patterning the patterned metal layer upon the device comprise:

at the contact interface between the patterned metal layer and the source and body regions, adding a contact enhancement plug for improving the quality and reliability of said contact interface; and at the contact interface between the patterned metal layer and the PNCTGS, adding a contact enhancement plug for improving the quality and reliability of said contact interface.

8. The method of claim 1 wherein implanting the body regions and source regions being carried out after the stripped off of the hard mask and before the deposition of the second nitride layer.

* * * * *